US 7,755,415 B2

(12) United States Patent
Zhang

(10) Patent No.: US 7,755,415 B2
(45) Date of Patent: Jul. 13, 2010

(54) TRANSISTOR CELL AND RELATED CIRCUITS AND METHODS

(75) Inventor: Shuyun Zhang, Allston, MA (US)

(73) Assignee: Analog Devices, Inc., Norwood, MA (US)

( * ) Notice: Subject to any disclaimer, the term of this patent is extended or adjusted under 35 U.S.C. 154(b) by 135 days.

(21) Appl. No.: 11/409,622

(22) Filed: Apr. 24, 2006

(65) Prior Publication Data

US 2007/0247212 A1    Oct. 25, 2007

(51) Int. Cl.
*H03K 17/687* (2006.01)
(52) U.S. Cl. .................... 327/430; 327/427
(58) Field of Classification Search ......... 327/355–359, 327/427, 434–437, 403, 404, 473; 330/254; 455/333
See application file for complete search history.

(56) References Cited

U.S. PATENT DOCUMENTS

| | | | | |
|---|---|---|---|---|
| 6,515,531 | B2 * | 2/2003 | Ruff et al. | 327/310 |
| 6,879,643 | B2 * | 4/2005 | Dedieu et al. | 375/316 |
| 2002/0113650 | A1 * | 8/2002 | Kim et al. | 330/254 |
| 2003/0169089 | A1 * | 9/2003 | Manku et al. | 327/359 |

* cited by examiner

*Primary Examiner*—Lincoln Donovan
*Assistant Examiner*—Diana J Cheng
(74) *Attorney, Agent, or Firm*—Knobbe, Martens, Olson & Bear LLP

(57) ABSTRACT

A transistor cell is provided that includes transistors arranged to turn on for different voltages applied to a control terminal of the transistor cell. The transistor cell can include a first transistor having a gate, a source, and a drain, and a second transistor having a gate, a source, and a drain, wherein the source of the second transistor is coupled to the source of the first transistor, and the drain of the second transistor is coupled to the drain of the first transistor. The transistor cell can further include a first resistor coupled between the gate of the first transistor and the gate of the second transistor. A frequency mixer is also provided that includes at least one transistor cell.

13 Claims, 6 Drawing Sheets

TRANSISTOR CELL AND RELATED CIRCUITS AND METHODS

FIELD OF INVENTION

The present invention relates generally to transistor cells, as well as related components, systems, and methods, and more particularly to transistor cells that may be employed in frequency mixers.

BACKGROUND

Transistors are basic electronic elements used in a plethora of electronic circuits and related components. In some circuits, transistors are used as switches that may enable a signal applied to the gate terminal of a transistor to modulate a channel resistance. As a result of the modulation of the transistor channel resistance, a drain current flowing through the transistor can be controlled. In general, in the case of enhancement mode field effect transistors, a substantial current commences to flow through the drain of the transistor for gate voltages greater than a threshold voltage. The drain current flowing through the transistor is approximately proportional to the square of the applied gate voltage minus the transistor's threshold voltage. In addition, other transistor characteristics can also vary with the applied gate voltage. For example, various resistive and capacitive parasitics can vary considerably with the applied gate voltage.

SUMMARY

The embodiments presented herein provide transistor cells, as well as related components, systems, and methods, including, but not limited to, frequency mixers including transistor cells.

In one embodiment, a transistor cell is provided that comprises a first transistor having a gate, a source, and a drain, a second transistor having a gate, a source, and a drain, wherein the source of the second transistor is coupled to the source of the first transistor, and the drain of the second transistor is coupled to the drain of the first transistor, and a first resistor coupled between the gate of the first transistor and the gate of the second transistor.

In another embodiment, a frequency mixer comprises a first transistor cell comprising a first transistor having a gate, a source, and a drain, a second transistor having a gate, a source, and a drain, wherein the source of the second transistor is coupled to the source of the first transistor, and the drain of the second transistor is coupled to the drain of the first transistor, and a first resistor coupled between the gate of the first transistor and the gate of the second transistor.

In yet another embodiment, a frequency mixer is provided that comprises at least one transistor cell having a control terminal, the transistor cell comprising a plurality of transistors arranged to turn on for different voltages applied to the control terminal of the transistor cell, and wherein the at least one transistor cell is at least partially involved in a frequency mixing operation.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Certain embodiments of the invention provide transistor cells and components including transistor cells, including, but not limited to, frequency mixers. As previously described, transistor parasitics can vary with applied gate voltage. Variation of transistor parasitics with gate voltage can impact the linearity of the transistor and of circuits in which the transistor is utilized. In some embodiments, one or more transistors in a given circuit can be replaced with a transistor cell comprising a plurality of transistors. The transistors in the transistor cell can be arranged so as to result in a reduction in the variation of one or more parasitics of the transistor cell with applied gate voltage, as compared to the variation of the corresponding parasitics of a single transistor. As a result, the incorporation of the transistor cell may result in an improvement of one or more linearity-related circuit characteristics. For example, the use of a transistor cell, as opposed to a single transistor, can result in an increase in the third order intercept point of frequency mixer circuits.

In various embodiments, a transistor cell including a parallel connection of transistors can allow for a higher linearity response when each of the transistors turns on for a different voltage value applied to a control terminal of the transistor cell. In some embodiments, the transistor cell has a third order intercept (e.g., an input third order intercept, an output third order intercept) greater than about 30 dBm (e.g., greater than 35 dBm, greater than 40 dBm, greater than 45 dBm). Such a response may be accomplished via various transistor arrangements within transistor cell. In some embodiments, such a response may be achieved by introducing voltage shifting resistors between the control terminal of the cell and the plurality of transistors within the transistor cell. Alternatively, or additionally, voltage shifting resistors need not necessarily be present, and the transistors themselves may be engineered so as to possess different threshold voltages. This can be accomplished by varying implantation doses used to set the threshold voltage of the transistors in the transistor cell. It should be appreciated that such a variation may require modifications in the transistor fabrication process, whereas the use of voltage shifting resistors may not necessarily require fabrication process modification.

It should be appreciated that the embodiments presented herein may be implemented using various types of transistors, including but not limited to, metal oxide semiconductor field effect transistors (MOSFET), metal semiconductor field effect transistors (MESFET), high-electron mobility field effect transistors (HEMT), and/or junction field effect transistors (JFET).

Figure 1A:
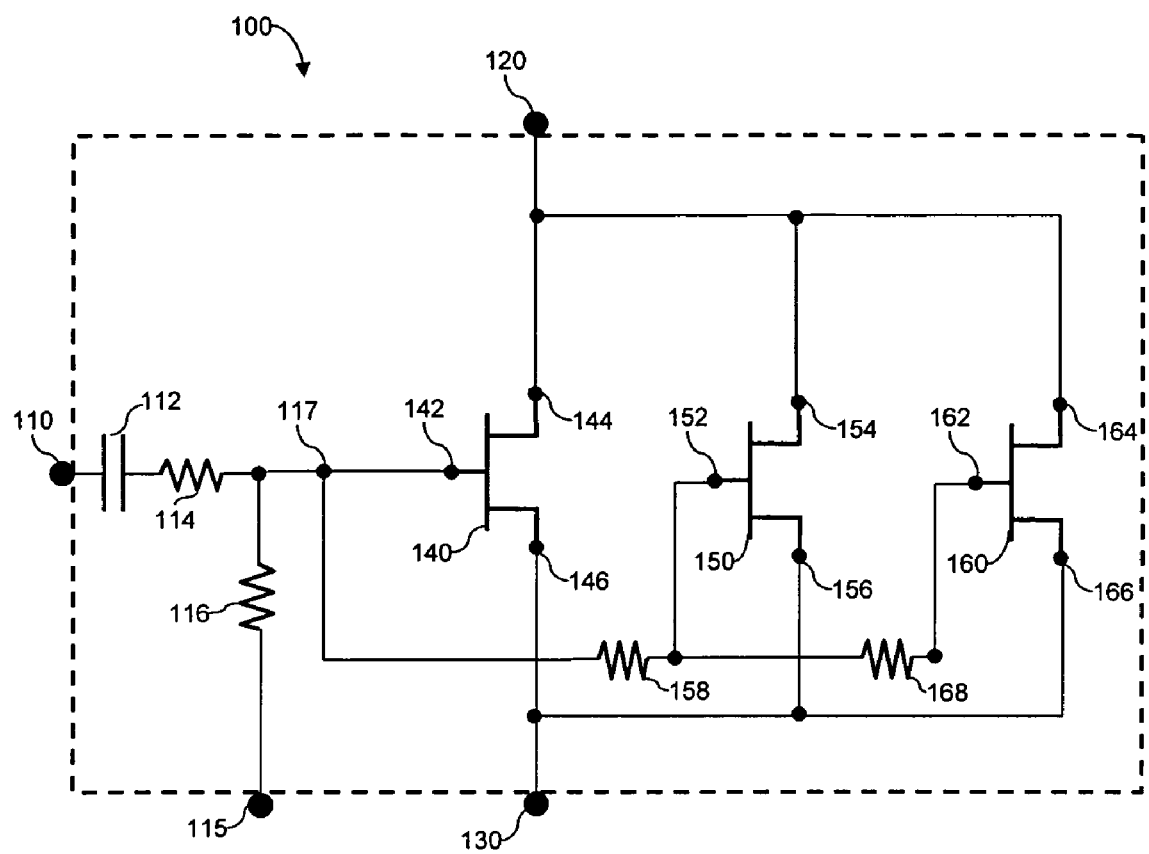
FIG. 1a is a schematic representation of a transistor cell.

FIG. 1a is a schematic representation of a transistor cell according to an embodiment. It should be appreciated that even though the embodiment illustrated in FIG. 1a includes three transistors, transistor cells can comprise any plurality of transistors (e.g., two, three, four, five, six transistors), and need not be limited to the illustrated embodiments. In the embodiment illustrated in FIG. 1s, transistor cell 100 has a drain terminal 120, a source terminal 130, and control terminals 110 and 115. Transistor cell 100 includes transistors 140, 150, and 160.

Transistor 140 has a drain terminal 144 connected to the drain terminal 120 of transistor cell 100. Transistor 140 has a source terminal 146 connected to the source terminal 130 of the transistor cell 100. Transistor 150 has a drain terminal 154 connected to the drain terminal 120 of transistor cell 100. Transistor 150 has a source terminal 156 connected to the source terminal 130 of the transistor cell 100. Transistor 160 has a drain terminal 164 connected to the drain terminal 120 of transistor cell 100. Transistor 160 has a source terminal 166 connected to the source terminal 130 of the transistor cell 100. Via such an arrangement, the transistors within the transistor cell 100 can form a parallel connection of transistors, whereby current flowing from the transistor cell drain 120 to the transistor cell source 130 is the summation of currents flowing within the drain-to-source channels of the transistors 140, 150, and 160, and whereby the each transistor 140, 150, and 160 has the same voltage applied across their respective drain and source terminals.

Transistor 140 further includes a gate terminal 142 coupled to a gate node 117 of the transistor cell 100. Transistor 150 further comprises a gate terminal 152 connected to a first terminal of a resistor 158. Resistor 158 further comprises a second terminal connected to the gate node 117 of transistor cell 100. Transistor 160 further comprises a gate terminal 162 connected to a first terminal of a resistor 168. Resistor 168 comprises a second terminal connected to the first terminal of resistor 158.

The abovementioned arrangement of transistors 140, 150, and 160, and of resistors 158 and 168 results in a parallel coupling of the transistors, wherein a control signal at gate node 117 can turn on transistors 140, 150, and 160 for different values of the control voltage applied to the gate node 117. In the illustrated configuration of transistor cell 100, the resistors 158 and 168 can serve as voltage shifting resistors which can shift the voltage which is applied to gate terminal 152 of transistor 150 and to gate terminal 162 of transistor 160, as compared to the voltage applied to gate terminal 142 of transistor 140. Therefore, the resistors 158 and 168 can enable the turn on of the transistors 140, 150, and 160 at the different control voltages applied to gate node 117. Such action can result in a gradual turn on of transistor cell 100 as a whole, and as a result, a gradual variation of one or more parasitics of the transistor cell as a function of the control voltage applied to gate node 117.

In some embodiments, the transistor cell 100 can further comprise capacitor 112 and resistor 114 connected in series. Resistor 114 has a first terminal connected to gate node 117 and a second terminal connected to a first plate of capacitor 112. Capacitor 112 has a second plate connected to a capacitive control terminal 110 of the transistor cell 100. The transistor cell 100 can further comprise a resistor 116 having a first terminal also connected to gate node 117 and a second terminal connected to a resistive control terminal 115 of the transistor cell 100.

The transistor cell 100, or variants thereof, may be operated as a single transistor normally would. Operation of transistor cell 100 may include the application of a first control signal to the capacitive control terminal 110 and/or a second control signal to the resistive control terminal 115. In some embodiments, a bias voltage may be applied to the control terminal 115, whereas a varying control signal may be applied to the control terminal 110. In other embodiments, for instance, for embodiments where capacitor 112, resistor 114, and resistor 116 are not necessarily present, a control signal may be applied to the gate node 117 of the transistor cell.

Via the application of the one or more control signals, the current flowing from the drain to source of transistors 140, 150, and 160 may be controlled. The presence of resistor 158, and resistor 168 can enable the turn on of transistors 140, 150, and 160 at different values of the signal at gate node 117. As a result of the transistors turning on for different values of the control signal on gate node 117, the individual parasitics of each transistor 140, 150, and 160 can vary differently as a function of the signal on gate node 117. Even though transistors 140, 150, and 160 may be similar, but need not necessarily be limited so, and therefore the individual parasitics of each transistor may have a similar functional dependence on the gate voltage applied to the gate of each transistor, the functional dependence on the each transistor's gate voltage on the gate node 117 voltage will be different as a result of voltage drops across resistors 158 and/or 168.

Thus, one or more of the parasitics of transistor cell 100, which are a combination of parasitics of each transistor, may vary more gradually as a function of the voltage on gate node 117, as compared to an equivalent single transistor having the combined width of transistors 150, 160, and 170. Although parallel connections of transistors have been previously used to allow higher currents to be handled via the distribution of the current between individual transistors, these previous parallel configurations of transistors were designed to turn on for the same voltage value applied to a common gate node of the parallel connection of transistors. In contrast, the embodiments of transistor cells presented herein are configured and arranged so that at least some of the transistors do not turn on for the same value of voltage applied to the common gate node of the parallel configuration.

Figure 1B:
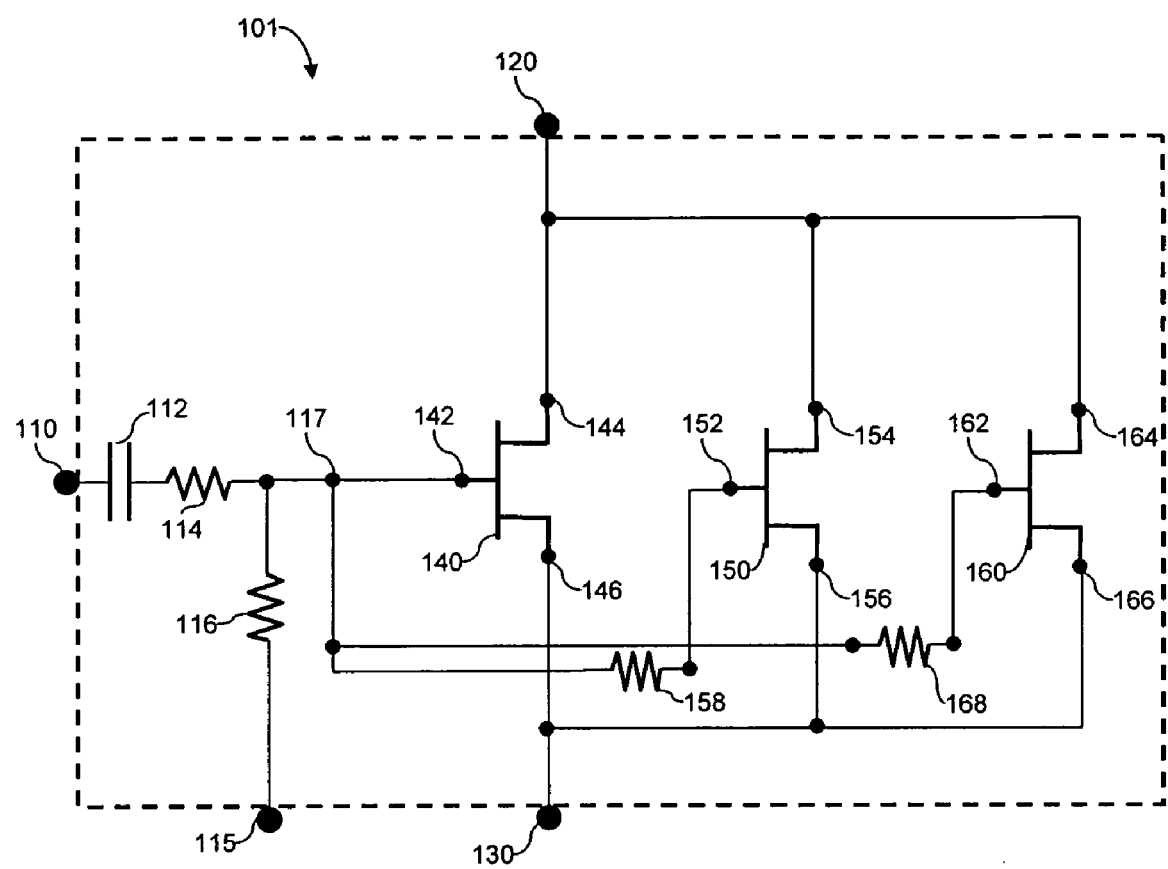
FIG. 1b is a schematic representation of another transistor cell.

It should be appreciated that a number of variations of the aforementioned transistor cell are possible, which may achieve similar operation as described for the transistor cell 100. FIG. 1b illustrates one such embodiment of another transistor cell 101, wherein a first terminal of resistor 168 is coupled to the gate 162 of transistor 160, and a second terminal of resistor 168 is coupled to the gate node 117. In such an arrangement, the resistance of resistors 168 and 158 may be chosen to be different so as to enable turn on of transistors 150 and 160 for different voltages on the gate node 117.

Transistor cells, such as transistor cells 100 and/or 101, may be utilized in a variety of circuit components and may replace one or more transistors present in such circuits. Depending on the application of the circuit component, the utilization of the aforementioned transistor cells as opposed to single transistors or previous transistor cells, may alter the overall characteristics of the circuit component. For example, the utilization of a transistor cell in a circuit component may result in a modification of the linearity characteristics of the circuit component. In particular, use of transistor cells in mixers may result in an increase in the third order intercept point of a frequency mixer circuit. Furthermore, the use of transistor cells in amplifier circuits may also result in a modification of the linearity of the amplifier. It should be appreciated that these are only some types of circuit components wherein the aforementioned transistor cells may be utilized, and other circuit components can also include the transistor cells presented herein. To further illustrate the use of transistor cells in circuit components, an illustrative embodiment of a passive frequency mixer is presented herein.

Figure 2:
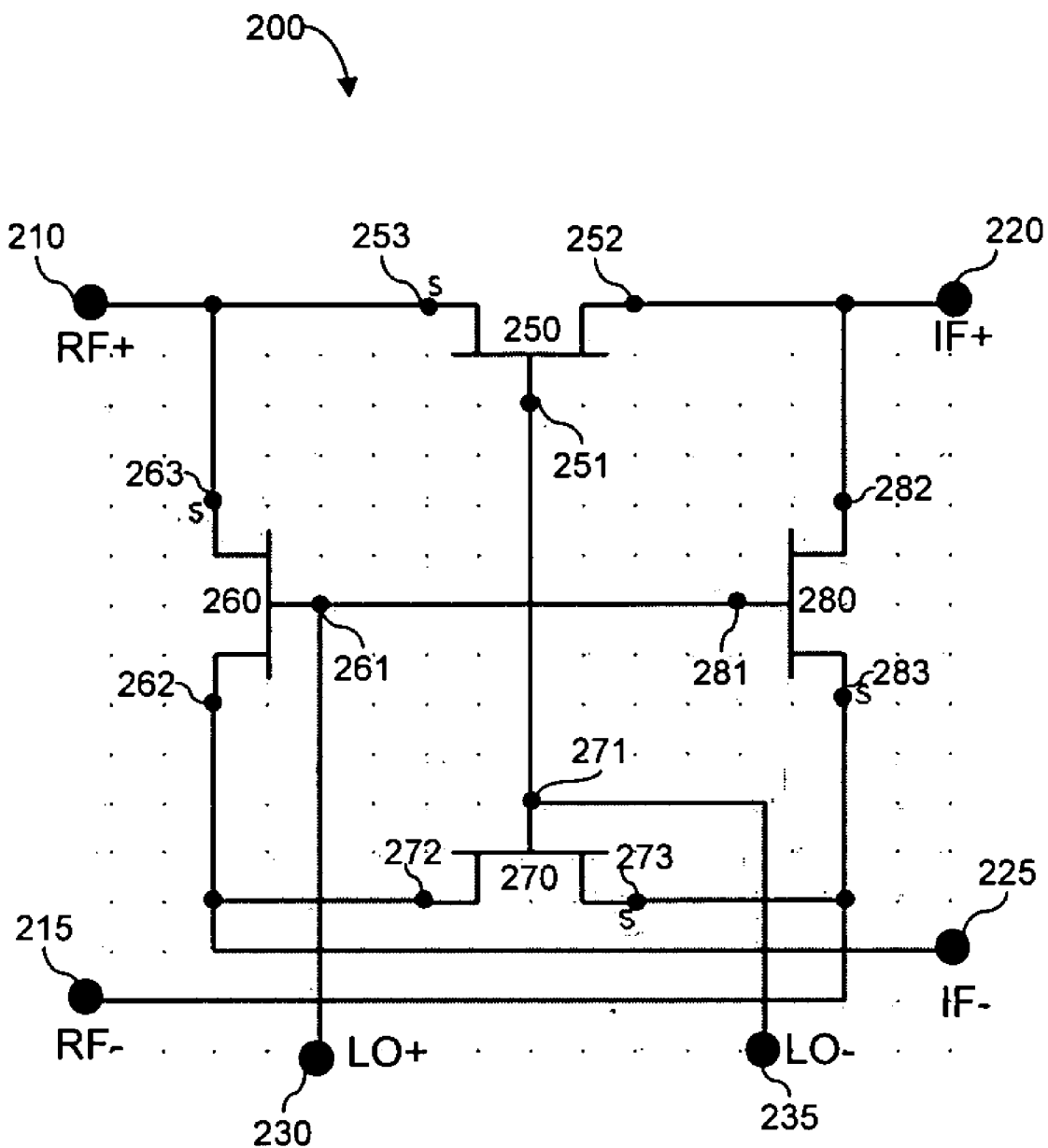
FIG. 2 is a schematic representation of a passive frequency mixer.

FIG. 2 is a schematic representation of a passive frequency mixer 200. The schematic representation 200 illustrates a mixing transistor circuit block of the passive mixer, and does not show balun circuits which may be coupled to the input and output terminals of the mixing transistor block so as to form a double balanced mixer, as is known to those of ordinary skill in the art. Typically, a mixer can have terminals for RF (radio frequency) signals, IF (intermediate frequency) signals, and LO (local oscillator) signals. In the illustration of FIG. 2, passive mixer 200 includes RF+ terminal 210, RF− terminal 215, IF+ terminal 220, IF− terminal 225, LO+ terminal 230, and LO− terminal 235.

Passive mixer 200 includes transistors 250, 260, 270, and 280. Transistor 250 has a source terminal 253 coupled to RF+ terminal 210 and also coupled to source terminal 263 of transistor 260. Transistor 250 also has a drain terminal 252 coupled to IF+ terminal 220 and also coupled to drain terminal 282 of transistor 280. Transistor 250 also has a gate terminal 251 coupled to gate terminal 271 of transistor 270 and also coupled to LO− terminal 235. Transistor 260 has a drain terminal 262 coupled to drain terminal 272 of transistor 270 and also coupled to IF− terminal 225. Transistor 270 further comprises a source terminal 273 coupled to source terminal 283 of transistor 280, and also coupled to RF− terminal 215. Transistor 280 further comprises a gate terminal 281 coupled to gate terminal 261 of transistor 260 and also coupled to LO+ terminal 230.

During operation, the passive mixer 200 can accept multiple frequency signals as input and generate an output signal that can include components with frequencies that are the sum and/or difference of the input frequencies. In one mode of operation, to generate the sum of two input frequencies, the LO terminals can receive one input signal and the IF terminals can receive another input signal. In such a mode, the RF terminals can serve as output terminals for an output signal having a component with a frequency that is the sum of the input frequencies. In another mode of operation, to generate the difference of two input frequencies, the LO terminals can receive one input signal and the RF terminals can receive another input signal. In this other mode, the IF terminals can serve as output terminals for an output signal having a component with a frequency that is the difference of the input frequencies.

The operation characteristics of a mixer can be characterized by various parameters, including intermodulation distortion, dynamic range, and third order intercept points. Third order intercept points can be defined based on test measurements wherein two small RF signals and one large LO signal are applied to a frequency mixer. The third order intercept points include an output third order intercept, commonly denoted by $OIP_3$, and an input third order intercept, commonly denoted by $IIP_3$. The third order intercept points are related to the linearity of the transistors that perform the frequency mixing operation within the mixer. As a result, the utilization of the aforementioned transistor cells having improved linearity, such as the transistor cells illustrated in FIG. 1, can improve the third order intercept points of mixers, such as the passive mixer illustrated in FIG. 2.

Figure 3:
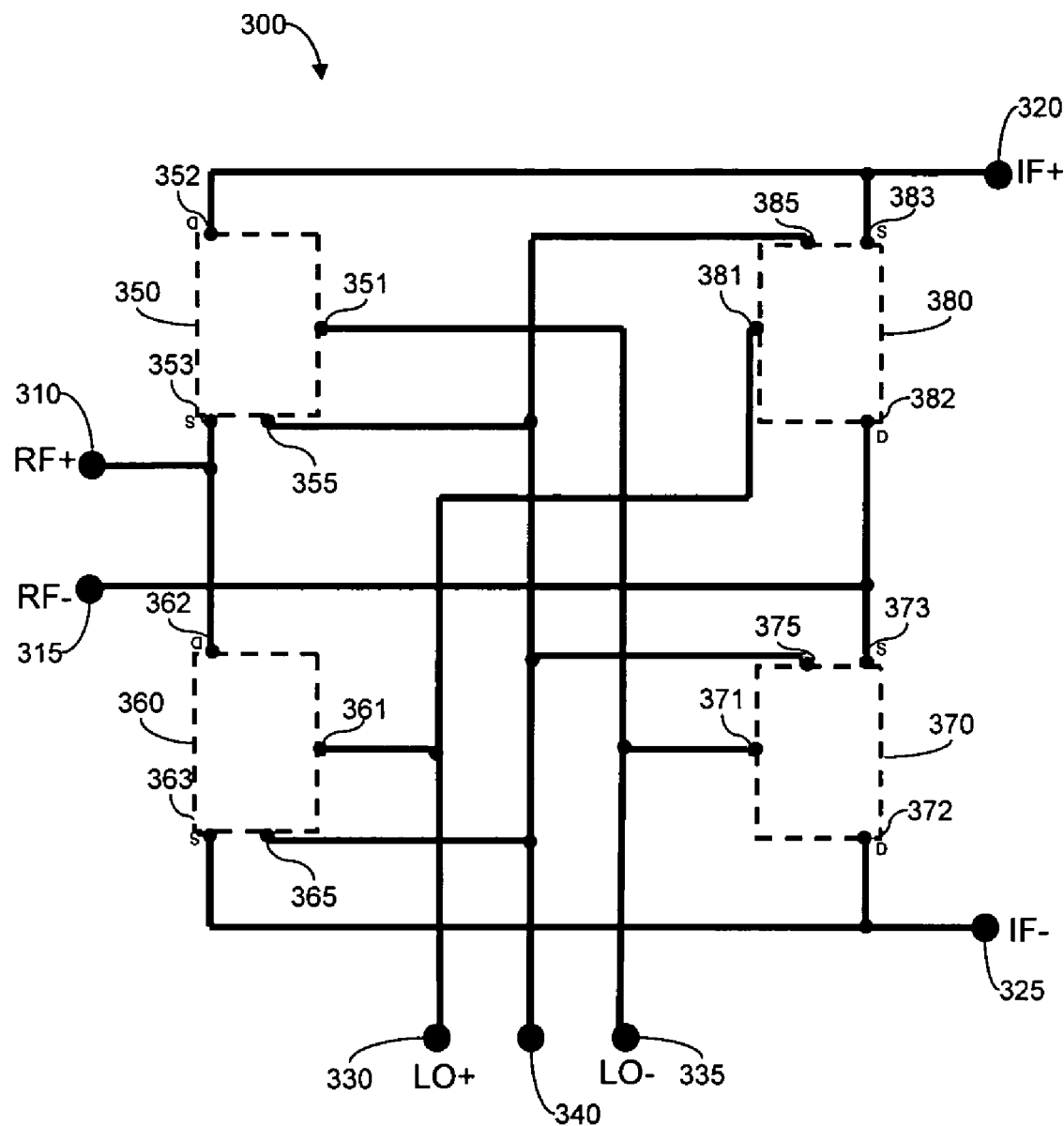
FIG. 3 is a schematic representation of a passive frequency mixer comprising transistor cells.

In some embodiments, a frequency mixer comprises transistor cells that include a parallel connection of transistors, wherein each transistor turns on for a different voltage on the gate node of the transistor cell. FIG. 3 is a schematic representation of a passive frequency mixer comprising transistor cells, according to one embodiment of the invention. Passive mixer 300 includes RF+ terminal 310, RF− terminal 315, IF+ terminal 320, IF− terminal 325, LO+ terminal 330, LO− terminal 335, and bias terminal 340. Passive mixer 300 includes transistor cells 350, 360, 370, and 380. Transistor cells 350, 360, 370, and 380 may be similar to transistor cells illustrated in FIG. 1, but need not be limited to just the illustrated transistor cells of FIG. 1.

In the embodiment of FIG. 3, transistor cell 350 has a source terminal 353 coupled to RF terminal 310 and also coupled to a drain terminal 362 of transistor cell 360. Transistor cell 350 also comprises a drain terminal 352 coupled to a source terminal 383 of transistor cell 380 and also coupled to IF+ terminal 320. Transistor cell 350 also comprises a capacitive control terminal 351 coupled to a capacitive control terminal 371 of transistor 370 and also coupled to LO− terminal 335. Transistor cell 350 also includes a resistive control terminal 355 coupled to a resistive terminal 385 of transistor cell 380, a resistive control terminal 365 of transistor cell 360, a resistive control terminal 375 of transistor 370, and bias terminal 340. Transistor cell 360 also comprises source terminal 363 coupled to a drain terminal 372 of transistor cell 370 and also coupled to IF− terminal 325. Transistor cell 360 also comprises capacitive control terminal 361 coupled to a capacitive control terminal 381 of transistor cell 380 and also coupled to LO+ terminal 330. Transistor cell 370 also comprises a source terminal 373 coupled to a drain terminal 382 of transistor cell 380 and also coupled to RF− terminal 315.

The operation of passive mixer 300 is similar to the operation of passive mixer 200 described previously, except that the mixing transistors 250-280 are replaced with transistor cells 350-380, and therefore the transistors within the transistor cells turn on at different voltage values applied to the control terminals of the transistor cell. As previously described, such a configuration can improve the third order intercept (e.g., an input third order intercept, an output third order intercept) of the passive mixer. In some embodiments, the frequency mixer has a third order intercept (e.g., an input third order intercept, an output third order intercept) greater than about 30 dBm (e.g., greater than 35 dBm, greater than 40 dBm, greater than 45 dBm).

Some working examples are presented to illustrate various computer simulation results for passive mixers incorporating transistor cells, for example, transistor cells including a parallel connection of transistors, wherein each transistor turns on for a different voltage on the gate node of the transistor cells. It should be understood that these working examples do not limit the embodiments. In one working example of a double balanced passive mixer, as illustrated in the circuit schematic of FIG. 3, third order intercept values were calculated during down conversion operation of the passive mixer. Specifically, a computer simulation involved applying two small RF signals and one large LO signal to the passive mixer, and third order intercepts and power gain were determined as a function of output power of both tones and also as a function of LO power.

Figure 4:
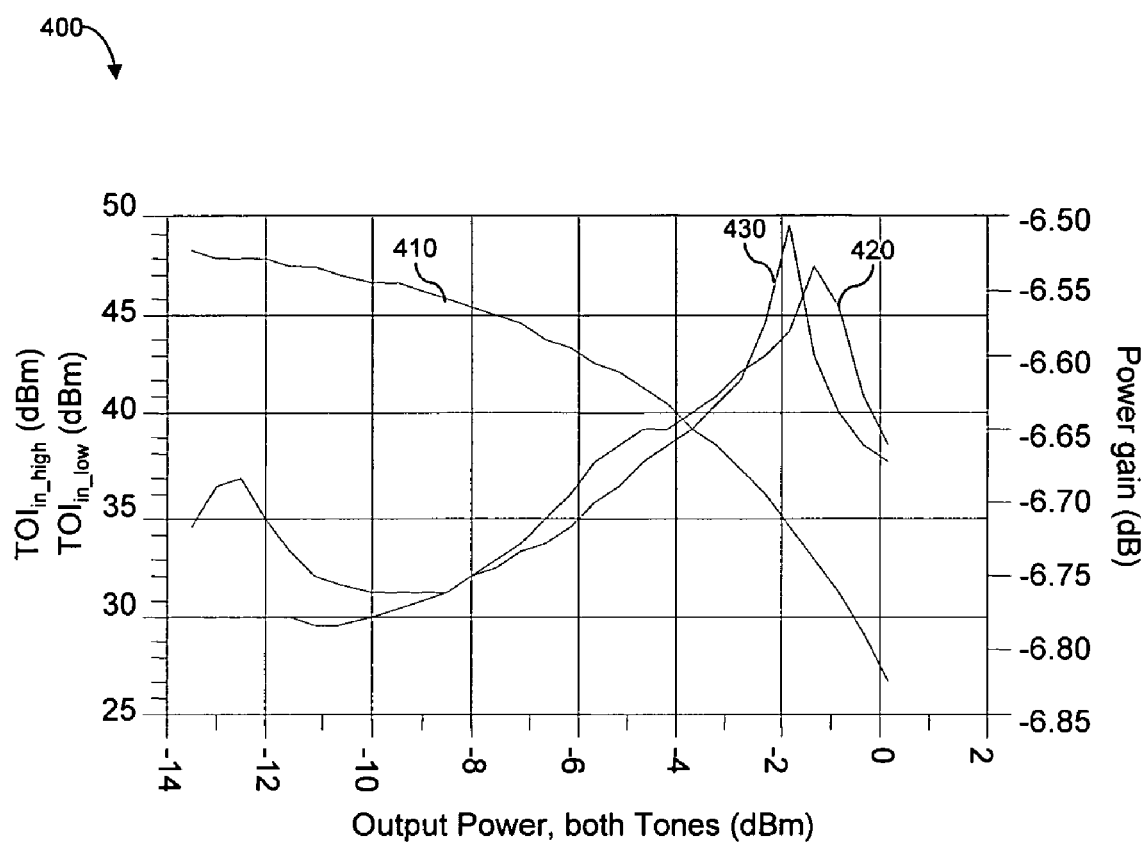
FIG. 4 is a graph of simulation results of power gain and input third order intercepts as a function of output power for the passive mixer of FIG. 3 including the transistor cells of FIG. 1.

FIG. 4 is a graph 400 of simulation results including a curve 410 showing a simulated power gain of the passive mixer in units of db as a function of the output power for both tones applied to the passive mixer during down conversion. Graph 400 further includes an input third order intercept high curve 430 and an input third order intercept low curve 420. As compared to prior art passive mixers including single transistor instead of transistor cells, the input third order intercepts may be increased by a factor of about greater than 5 dB (e.g., greater than 6 dB, greater than 7 dB, greater than 8 dB).

Figure 5:
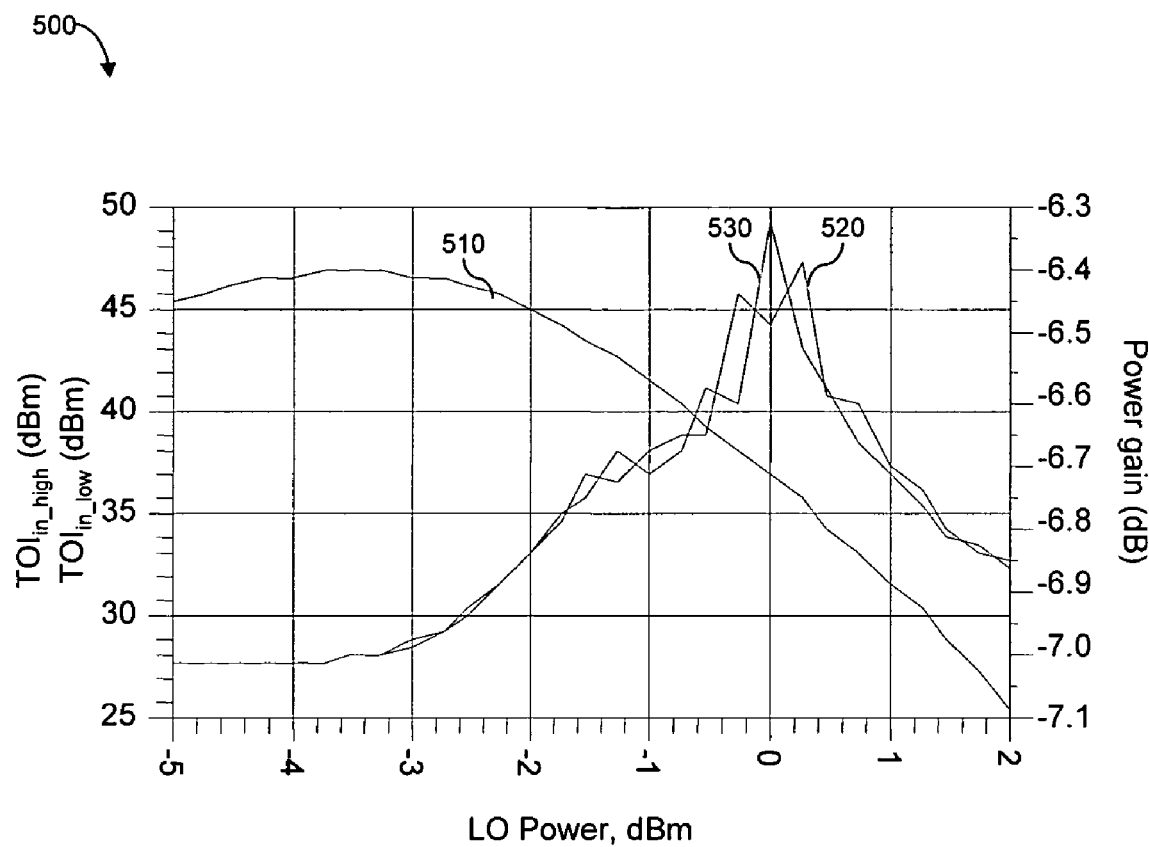
FIG. 5 is a graph of simulation results of power gain and input third order intercepts as a function of LO power for the passive mixer of FIG. 3 including the transistor cells of FIG. 1.

FIG. 5 is a graph 500 of simulation results including a curve 510 showing a simulated power gain of the passive mixer in units of db as a function of the LO power applied to the passive mixer during down conversion. Graph 500 further includes an input third order intercept high curve 530 and an input third order intercept low curve 520.

As should be appreciated from the foregoing, there are numerous aspects of the present invention described herein that can be used independently of one another, including the aspects that relate to transistor cells, transistor cells including a parallel connection of transistors, transistor cells wherein each transistor in the cell turns on for a different voltage on a gate node of the cell, and components that may include transistor cells, including, but not limited to, frequency mixers.

Various aspects of the present invention may be used alone, in combination, or in a variety of arrangements not specifically discussed in the embodiments described in the foregoing, and the aspects of the present invention described herein are not limited in their application to the details and arrangements of components set forth in the foregoing description or illustrated in the drawings. The aspects of the invention are capable of other embodiments and of being practiced or of being carried out in various ways. Accordingly, the foregoing description and drawings are by way of example only.

Also, the phraseology and terminology used herein is for the purpose of description and should not be regarded as limiting. The use of "including," "comprising," or "having," "containing," "involving," and variations thereof herein, is meant to encompass the items listed thereafter and equivalent thereof as well as additional items.

What is claimed:

1. A frequency mixer comprising:
    a first transistor cell comprising:
        a first control terminal;
        a first transistor having a gate, a source, and a drain, the gate coupled to the first control terminal; and
        a second transistor having a gate, a source, and a drain, the gate coupled to the first control terminal;
        wherein the source of the second transistor is coupled to the source of the first transistor, and the drain of the second transistor is coupled to the drain of the first transistor;
        wherein the first and second transistors are configured to turn on for different voltages applied to the first control terminal;
    a second transistor cell comprising:
        a second control terminal;
        a third transistor having a gate, a source, and a drain, the gate coupled to the second control terminal; and
        a fourth transistor having a gate, a source, and a drain, the gate coupled to the second control terminal;
        wherein the source of the third transistor is coupled to the source of the fourth transistor, and the drain of the third transistor is coupled to the drain of the fourth transistor;
        wherein the third and fourth transistors are configured to turn on for different voltages applied to the second control terminal;
    a third transistor cell comprising:
        a third control terminal;
        a fifth transistor having a gate, a source, and a drain, the gate coupled to the third control terminal; and
        a sixth transistor having a gate, a source, and a drain, the gate coupled to the third control terminal;
        wherein the source of the fifth transistor is coupled to the source of the sixth transistor, and the drain of the fifth transistor is coupled to the drain of the sixth transistor;
        wherein the fifth and sixth transistors are configured to turn on for different voltages applied to the third control terminal; and
    a fourth transistor cell comprising:
        a fourth control terminal;
        a seventh transistor having a gate, a source, and a drain, the gate coupled to the fourth control terminal; and
        an eighth transistor having a gate, a source, and a drain, the gate coupled to the fourth control terminal;
        wherein the source of the seventh transistor is coupled to the source of the eighth transistor, and the drain of the seventh transistor is coupled to the drain of the eighth transistor;
        wherein the seventh and eighth transistors are configured to turn on for different voltages applied to the fourth control terminal;
    wherein the gate of the first transistor is coupled to the gate of the fifth transistor, and the gate of the third transistor is coupled to the gate of the seventh transistor;
    wherein the drain of the first transistor is coupled to the source of the seventh transistor;
    wherein the source of the third transistor is coupled to the drain of the fifth transistor;
    wherein the first, second, third, and fourth control terminals are configured to receive input signals having a same first frequency;
    wherein the first, second, third, and fourth transistor cells are configured to receive input signals having a same second frequency; and
    wherein the frequency mixer is configured to provide an output signal having a frequency that is a combination of the first frequency and the second frequency.

2. The frequency mixer of claim 1, wherein the frequency mixer is a passive frequency mixer.

3. The frequency mixer of claim 1, wherein the first transistor cell further comprises:
    a ninth transistor having a gate, a source, and a drain, the gate coupled to the first control terminal;
    wherein the source of the ninth transistor is coupled to the source of the first transistor, and the drain of the ninth transistor is coupled to the drain of the first transistor; and
    wherein the first, second, and ninth transistors are configured to each turn on for a different voltage applied to the first control terminal.

4. The frequency mixer of claim 1, wherein the source of the first transistor is coupled to the drain of the third transistor.

5. The frequency mixer of claim 4, wherein the source of the fifth transistor is coupled to the drain of the seventh transistor.

6. The frequency mixer of claim 1, wherein the frequency mixer has an input third order intercept greater than 30 dBm.

7. The frequency mixer of claim 1, wherein the first transistor cell further comprises a first resistor coupled between the gate of the first transistor and the gate of the second transistor.

8. The frequency mixer of claim 7, wherein the first transistor cell further comprises:
    a ninth transistor having a gate, a source, and a drain, wherein the source of the ninth transistor is coupled to the source of the first transistor, and the drain of the ninth transistor is coupled to the drain of the first transistor; and
    a second resistor coupled between the gate of the second transistor and the gate of the ninth transistor.

9. The frequency mixer of claim 7, wherein the first transistor cell further comprises:

a ninth transistor having a gate, a source, and a drain, wherein the source of the ninth transistor is coupled to the source of the first transistor, and the drain of the ninth transistor is coupled to the drain of the first transistor; and a second resistor coupled between the gate of the first transistor and the gate of the ninth transistor.

10. The frequency mixer of claim 7, wherein the frequency mixer is a passive frequency mixer.

11. The frequency mixer of claim 7, wherein the source of the first transistor is coupled to the drain of the third transistor.

12. The frequency mixer of claim 11, wherein the source of the fifth transistor is coupled to the drain of the seventh transistor.

13. The frequency mixer of claim 7, wherein the frequency mixer has an input third order greater than 30 dBm.

* * * * *

UNITED STATES PATENT AND TRADEMARK OFFICE
CERTIFICATE OF CORRECTION

PATENT NO. : 7,755,415 B2
APPLICATION NO. : 11/409622
DATED : July 13, 2010
INVENTOR(S) : Shuyun Zhang Page 1 of 1

It is certified that error appears in the above-identified patent and that said Letters Patent is hereby corrected as shown below:

At column 10 (claim 13), line 7, after "order" insert --intercept--.

Signed and Sealed this
Fifth Day of April, 2011

David J. Kappos
*Director of the United States Patent and Trademark Office*